(12) United States Patent
Avitan

(10) Patent No.: US 8,081,040 B1
(45) Date of Patent: Dec. 20, 2011

(54) METHOD AND APPARATUS FOR OSCILLATING

(75) Inventor: Shimon Avitan, Kiryat Ata (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 172 days.

(21) Appl. No.: 12/497,924

(22) Filed: Jul. 6, 2009

Related U.S. Application Data

(60) Provisional application No. 61/084,139, filed on Jul. 28, 2008.

(51) Int. Cl.
*H03L 1/00* (2006.01)

(52) U.S. Cl. .............................. 331/186; 331/57; 331/176

(58) Field of Classification Search ...................... 331/57, 331/176, 185, 186
See application file for complete search history.

(56) References Cited

U.S. PATENT DOCUMENTS

| 5,426,398 A * | 6/1995 | Kuo | 331/57 |
| 7,629,856 B2 * | 12/2009 | Thaller | 331/57 |

* cited by examiner

*Primary Examiner* — Robert Pascal
*Assistant Examiner* — James E Goodley

(57) ABSTRACT

Aspects of the disclosure provide a voltage controlled oscillator. The voltage controlled oscillator can include a plurality of oscillation stages coupled together to generate an oscillation signal having an oscillation frequency. At least one oscillation stage of the plurality of oscillation stages can include a first portion driven by a first driving power that can be a function of a control voltage and a second portion driven by a second driving power that can be substantially independent of the control voltage. The first driving power can be provided by a first power rail in the form of a driving current that is a function of the control voltage. The second driving power can be provided by a second power rail in the form of a substantially constant voltage that is substantially independent of the control voltage.

21 Claims, 6 Drawing Sheets

METHOD AND APPARATUS FOR OSCILLATING

INCORPORATION BY REFERENCE

This application claims the benefit of U.S. Provisional Application No. 61/084,139, "System and Method for Rail to Rail Gain Suppression" filed on Jul. 28, 2008, which is incorporated herein by reference in its entirety.

BACKGROUND

Oscillators can be used in integrated circuits for various purposes. For example, a voltage controlled oscillator can be associated with a phase-locked loop (PLL) module to generate an internal clock signal having its phase locked to a received signal. The PLL module may include a phase detector coupled to the voltage controlled oscillator. The phase detector may detect a phase difference of the internal clock signal and the received signal. The phase difference can be converted to a voltage signal. The voltage signal can be used to vary an oscillation frequency of the voltage controlled oscillator, such that the phase of the internal clock signal can be locked to the received signal.

SUMMARY

Aspects of the disclosure can provide a voltage controlled oscillator. The voltage controlled oscillator may be, for example, included as part of controller circuitry, processing core, SERDES, or other electronic circuitry that may be incorporated into any suitable electronic device such as an Ethernet switch, wireless telecommunication device, mobile user equipment for a cellular network or any other suitable electronics device. The voltage controlled oscillator can include a plurality of oscillation stages coupled together to generate an oscillation signal having an oscillation frequency. At least one oscillation stage of the plurality of oscillation stages can include a first portion driven by a first driving power that is a function of a control voltage and a second portion driven by a second driving power that is substantially independent of the control voltage.

In an embodiment, the voltage controlled oscillation can include a first power rail configured to provide the first driving power in the form of a driving current that is a function of the control voltage, and a second power rail configured to provide the second driving power in the form of a substantially constant voltage. Accordingly, the oscillation stage can include a delay cell coupled to the first power rail and a latch cell coupled to the second power rail. The delay cell can be configured to receive a stage input from a previous oscillation stage and drive a stage output to a next oscillation stage with the driving current that is the function of the control voltage. The latch cell can be configured to latch the stage output based on the substantially constant voltage. Further, the oscillation stage can be configured in a differential manner.

In an example, the voltage controlled oscillator can include a voltage regulator coupled to the second power rail. The voltage regulator can be configured to generate the substantially constant voltage based on a semiconductor band-gap voltage.

In another example, the voltage controlled oscillator can include a switch module having a control terminal for receiving the control voltage, a first channel terminal coupled to a power supply and second channel terminal coupled to the first power rail. The switch module can be configured to conduct the driving current from the first terminal to the second terminal based on the control voltage on the control terminal.

According to an aspect of the disclosure, the switch module can include at least one native metal oxide semiconductor (MOS) transistor that can conduct a current with zero gate-source voltage.

In an embodiment, the oscillation stage can be configured according to a current mode logic topology. In an example, the delay cell can include a MOS transistor having a gate terminal, a first channel terminal and a second channel terminal. The gate terminal can be configured to receive the stage input. Further, the delay cell can include a resistor configured to serially couple the MOS transistor between the first power rail and a ground node as a resistive load to the MOS transistor. Additionally, the latch cell can include a first inverter and a second inverter that can be cross coupled.

Aspects of the disclosure can provide a method for generating an oscillation signal. The method can include receiving a control voltage, and driving a first portion of an oscillation stage with a first driving power that is a function of the control voltage, and driving a second portion of the oscillation stage with a second driving power that is substantially independent of the control voltage.

Further, the method can include delivering a driving current based on the control voltage as the first driving power, and generating a substantially constant voltage as the second driving power.

Additionally, the method can include driving a delay cell of the oscillation stage with the driving current, and latching an output of the delay cell with the substantially constant voltage.

According to an embodiment of the disclosure, the substantially constant voltage can be generated to enable the output of the delay cell being logically recognizable without additional level shifting or level controlling. In an example, the substantially constant voltage can be generated based on a semiconductor band-gap voltage.

Aspects of the disclosure can also provide an electric device having an integrated circuit (IC) chip. The IC chip may include a phase-locked loop having a detector module and a voltage controlled oscillator (VCO) module coupled together. The detector module can be configured to detect a difference between an oscillation signal outputted from the VCO module and a received signal, and convert the difference into a control voltage. The VCO module can include a plurality of oscillation stages coupled together to generate the oscillation signal. At least one oscillation stage can include a first portion driven by a first driving power that is a function of the control voltage, and a second portion driven by a second driving power that is substantially independent of the control voltage.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
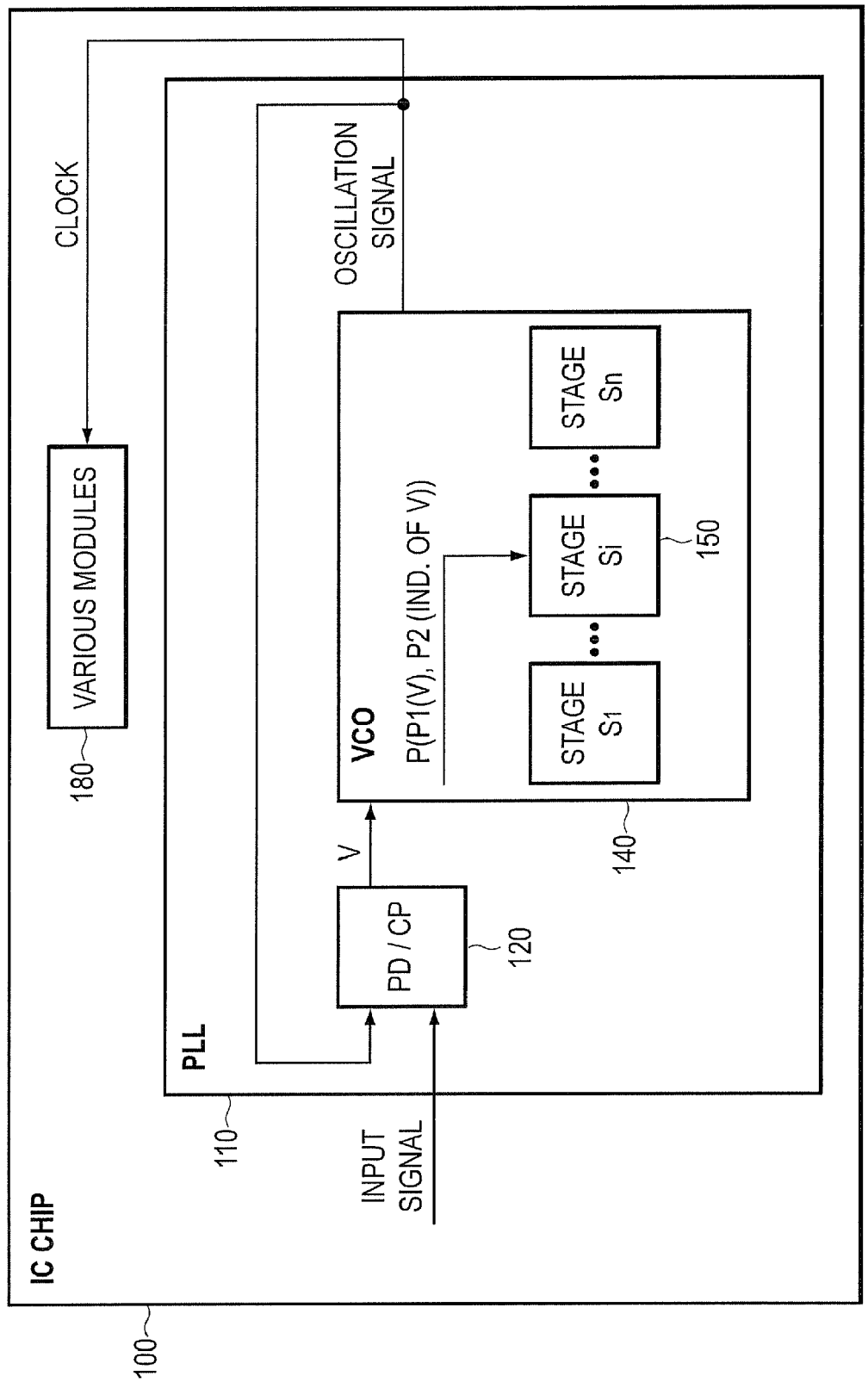
FIG. 1 shows a block diagram of an integrated circuit chip example according to an embodiment of the disclosure.

FIG. 1 shows a block diagram of an integrated circuit (IC) chip example according to an embodiment of the disclosure. The IC chip 100 can include a phase-locked loop module 110 for generating an internal clock signal. The phase-locked loop module 110 can include a voltage controlled oscillator (VCO) module 140, and a phase detector and charge pump (PD/CP) module 120. These elements can be coupled together as shown in FIG. 1, which is not drawn to scale.

The IC chip 100 can be used in any suitable electrical implementations, such as, without limitation, serializer/deserializer (SERDES), universal serial bus (USB), Ethernet switches, electronic controllers, processor cores, wireless communication devices, radio and/or applications processors for cell phones, and the like. Those electrical implementations may synchronize operations with regard to an input signal. For example, a SERDES may receive a serial data signal. The SERDES may need to synchronize operations to the serial data signal in order to de-serialize the serial data signal.

The phase-locked loop module 110 may receive the input signal, and generate the internal clock signal with its phase locked to the input signal. In the SERDES example, the phase-locked loop module 110 may receive the serial data signal, and generate an internal clock signal with its phase locked to the serial data signal. Then, the internal clock signal can be used by other parts of the IC chip 100 to synchronize operations to the serial data signal in order to de-serialize the serial data signal.

The PD/CP module 120 may receive the input signal and an oscillation signal feedback from the VCO module 140. Then, the PD/CP module 120 can compare the oscillation signal with the input signal for differences and generate a voltage signal V based on the differences of the input signal and the oscillation signal. In an embodiment, the voltage signal V can be generated based on a phase difference of the input signal and the oscillation signal. In another embodiment, the voltage signal V can be generated based on a frequency difference of the input signal and the oscillation signal.

In the FIG. 1 example, the voltage signal V can be generated by a charge pump circuit, which may charge a capacitor based on the differences of the input signal and the oscillation signal. It is noted that the voltage signal V can be generated by circuits other than the charge pump circuit, such as a low pass filter, and the like.

The VCO module 140 can receive the voltage signal V, and output the oscillation signal based on the voltage signal V. The oscillation signal can be provided as a clock signal to various modules 180 on the IC chip 100. The VCO module 140 can vary a frequency of the oscillation signal based on the voltage signal V. More specifically, the VCO module 140 can include a plurality of oscillation stages S1-Sn. At least one of the plurality of oscillation stages S1-Sn, for example Si, can receive a driving power that can include: a first portion that can be a function of the voltage signal V, and a second portion that can be substantially independent of the voltage signal V. In an embodiment, the oscillation stage Si may include a first cell (not shown) that may operate with the first portion of the driving power, and a second cell (not shown) that may operate with the second portion of the driving power. Both the first cell and the second cell can determine a delay of the oscillation stage Si. According to the disclosure, the VCO module 140 may have various features by suitably configuring the first portion and the second portion of the driving power, and/or the first cell and the second cell.

In an example, the VCO module 140 can be configured to suppress a VCO gain, which can be expressed as an oscillation frequency dependency on the voltage signal V. More specifically, the oscillation stage Si can be configured, for example, to increase a driving strength of the second cell, such that a delay dependency of the oscillation stage Si on the first cell can be reduced. Then, the VCO gain can be reduced.

In another example, the VCO module 140 can be configured to start oscillation at any suitable initial voltage signal. More specifically, the VCO module can be configured to be able to oscillate with the second portion of the driving power to drive both the first cell and the second cell when the first portion of the driving power is not available, for example, when the voltage signal is zero.

In addition, the VCO module 140 can be configured to have a wide frequency range, such as 1 GHz to 10 GHz. The wide frequency range can correspond to a wide voltage range of the voltage signal V. For example, when the phase-locked loop module 110 is designed based on a 1.8V technology, the VCO module 140 can be configured to oscillate with the voltage signal V within a range from 0V to 1.8V.

Further, the VCO module 140 can be configured to have reduced gate-oxide stress. In addition, the VCO module 140 can be configured to have oscillation peak values within recognizable logic levels for all frequencies, such that level shifting or automatic level control circuit for changing voltage levels, may be not needed.

Figure 2:
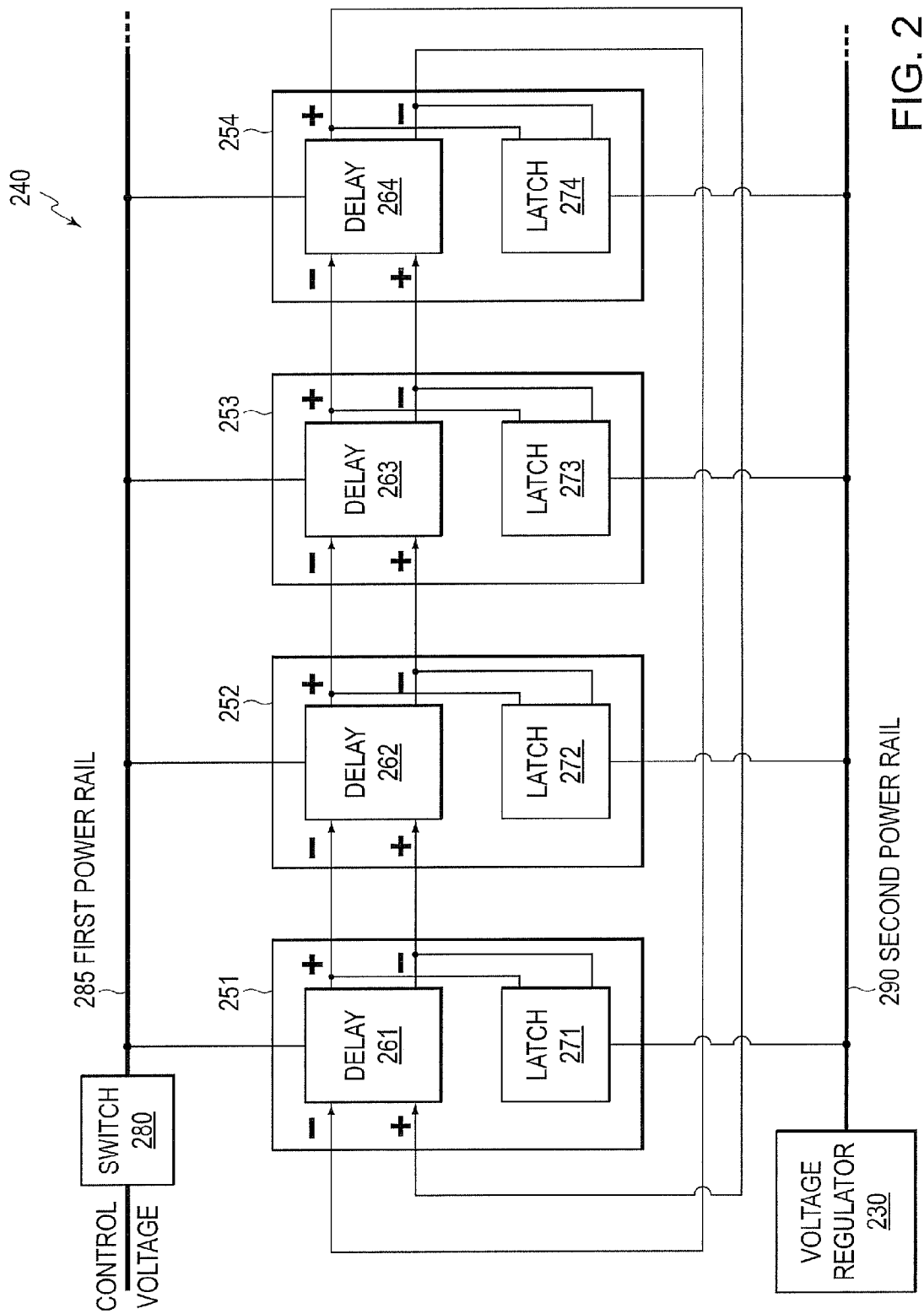
FIG. 2 shows a block diagram of a 4-stage voltage control ring oscillator example according to an embodiment of the disclosure.

FIG. 2 shows a block diagram of a 4-stage voltage controlled ring oscillator (VCRO) 240 example according to an embodiment of the disclosure. The 4-stage VCRO 240 can include 4 oscillation stages 251-254, a switch module 280 and a voltage regulator 230. These elements can be coupled together as shown in FIG. 2. The 4-stage VCRO 240 is shown by way of example only; a VCRO may include any suitable quantity of oscillation stages. The switch module 280 and the voltage regulator 230 can respectively provide a first portion and a second portion of a driving power for the 4 oscillation stages 251-254 to generate 8-phase oscillation signals.

The switch module 280 can receive a control voltage, and provide the first portion of the driving power for the 4 oscillation stages 251-254 based on the control voltage. In the FIG. 2 example, the switch module 280 can be coupled to a first power rail 285, and can output the first portion of the driving power to the first power rail 285. The first power rail 285 can direct the first portion of the driving power to the 4 oscillation stages 251-254. In an example, the switch module 280 can provide the first portion of the driving power in the current mode, thus the current from the first power rail 285 to the 4 oscillation stages 251-254 can be a function of the control voltage.

The voltage regulator 230 can provide the second portion of the driving power for the 4 oscillation stages 251-254. In the FIG. 2 example, the voltage regulator 230 can be coupled to a second power rail 290. The second power rail 290 can direct the second portion of the driving power to the 4 oscillation stages 251-254.

In an embodiment, the voltage regulator 230 can provide the second portion of the driving power in the form of a substantially constant voltage. The constant voltage can be substantially independent of the control voltage. In an example, the voltage regulator 230 can generate the substantially constant voltage based on a semiconductor band-gap voltage, which can be substantially independent of various variations, such as process variations, supply voltage variations, temperature variations, and the like. Thus, the generated voltage by the voltage regulator 230 can be substantially constant regardless of the process variations, supply voltage variations and the temperature variations. Further, the voltage regulator 230 can be configured to provide the second portion of the driving power solely to the 4 oscillation stages 251-254, and not to other circuits. Therefore, the second portion of the driving power can be substantially independent of the other circuits.

The four oscillation stages 251-254 can be configured in a differential manner. Each of the four oscillation stages 251-254 can include a positive stage input and a negative stage input to receive signals from a previous oscillation stage, and can include a positive stage output and a negative stage output to output signals to a next oscillation stage.

In addition, the four oscillation stages 251-254 can be coupled to enable oscillation. In the FIG. 2 example, the first oscillation stage 251 can receive the positive stage output of the fourth oscillation stage 254 as the positive stage input, and receive the negative stage output of the fourth oscillation stage 254 as the negative stage input; the second oscillation stage 252 can receive the positive stage output of the first oscillation stage 251 as the negative stage input, and receive the negative stage output of the first oscillation stage 251 as the positive stage input; the third oscillation stage 253 can receive the positive stage output of the second oscillation stage 252 as the negative stage input, and receive the negative stage output of the second oscillation stage 252 as the positive stage input; and the fourth oscillation stage 254 can receive the positive stage output of the third oscillation stage 253 as the negative stage input, and receive the negative stage output of the third oscillation stage 253 as the positive stage input. Accordingly, the VCRO 240 can output oscillation signals of 8 phases—the positive stage output and negative stage output of the first oscillation stage 251, the positive stage output and negative stage output of the second oscillation stage 252, the positive stage output and negative stage output of the third oscillation stage 253, and the positive stage output and negative stage output of the fourth oscillation stage 254.

At least one of the oscillation stages 251-254 can be coupled to both the first power rail 285 and the second power rail 290, and can operate with power provided by both the first power rail 285 and the second power rail 290. In the FIG. 2 example, each of the oscillation stages 251-254 can be coupled to both the first power rail 285 and the second power rail 290, and may delay the stage outputs to the stage inputs based on the first portion and the second portion of the driving power.

More specifically, each of the oscillation stages 251-254 can include a delay cell and a latch cell. For example, the oscillation stage 251 can include a delay cell 261 and a latch cell 271; the oscillation stage 252 can include a delay cell 262 and a latch cell 272; the oscillation stage 253 can include a delay cell 263 and a latch cell 273; and the oscillation stage 254 can include a delay cell 264 and a latch cell 274.

Further, the delay cells 261-264 and the corresponding latch cells 271-274 can be coupled together to determine a delay of each oscillation stage and further determine an oscillation frequency of the VCRO 240. In the FIG. 2 example, the delay cells 261-264 can be coupled to the first power rail 285 to drive the stage outputs by the first portion of the driving power provided by the switch module 280. In an example, the first portion of the driving power can be in the form of electrical current that are a function of the control voltage and the delay cells 261-264 can be configured according to current mode logic topology.

On the other hand, the latch cells 271-274 can be coupled to the second power rail 290 to drive the stage outputs by the second portion of the driving power provided by the voltage regulator 230. In an example, the second portion of the driving power can be in the form of a substantially constant voltage that is substantially independent of the control voltage.

Figure 3:
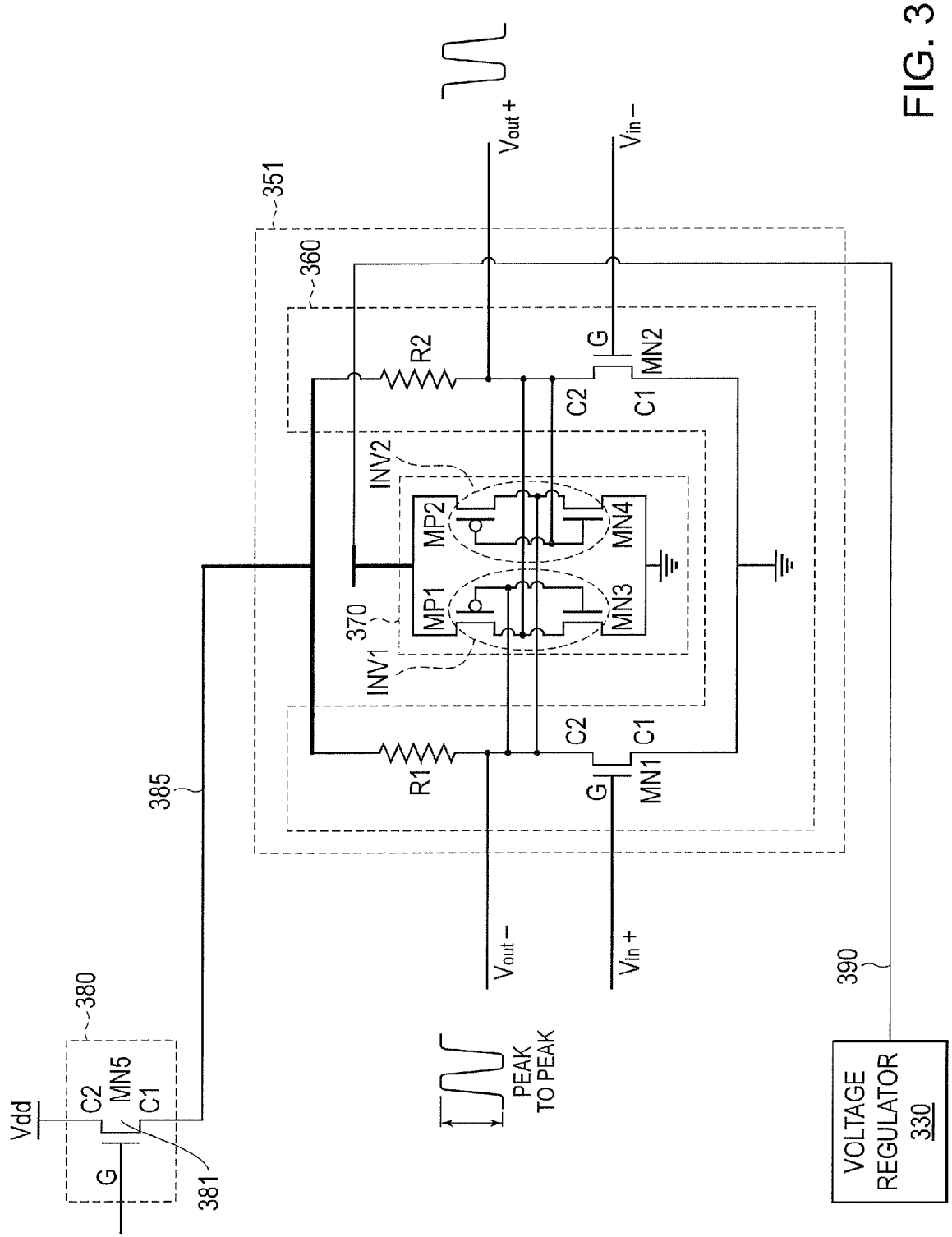
FIG. 3 shows a block diagram of an oscillation stage example according to an embodiment of the disclosure.

FIG. 3 shows a block diagram of an oscillation stage example according to an embodiment of the disclosure. The oscillation stage 351 can be coupled to a switch module 380 via a first power rail 385, and can be coupled to a voltage regulator 330 via a second power rail 390. The oscillation stage 351 can include a delay cell 360, and a latch cell 370. These elements can be coupled together as shown in FIG. 3.

The voltage regulator 330 can provide a substantially constant voltage to the latch cell 370. In an embodiment, the substantially constant voltage can be generated based on a semiconductor band-gap voltage, such that the substantially constant voltage can be substantially independent of various variations, such as process variations, supply voltage variations, temperature variations, and the like. The substantially constant voltage can be tunable by suitably configuring the voltage regulator 330.

The switch module 380 can receive a control voltage and provide a driving current based on the control voltage. In the FIG. 3 example, the switch module 380 can include, for example, an n-type metal oxide semiconductor (MOS) transistor MN5 that can be configured to conduct the driving current between a first channel terminal C1 and a second chaimel terminal C2 based on the control voltage on a gate terminal G. In an embodiment, the n-type MOS transistor MN5 can be configured to be a native transistor that conducts current with zero gate voltage, and can be configured to have thick gate oxide. For example, when a 1.8V technology is used to implement the circuit in FIG. 3, the n-type MOS transistor MN5 may have a gate oxide thickness that is more than double a gate oxide thickness that is generally used in the 1.8V technology. Due to the thick gate oxide, the n-type MOS transistor MN5 can accommodate an increased control voltage without being adversely impacted by stress on the gate oxide. Further, due to the reason that the n-type MOS transistor MN5 is native, the n-type MOS transistor MN5 may conduct current when the control voltage is 0V. Therefore, in accordance with an embodiment, the switch module 380 can be configured to operate properly with the control voltage varying, for example, between 0V and 1.8V in the 1.8V technology.

The delay cell 360 can be configured in a current mode logic (CML) topology. In addition, the delay cell 360 can be configured in a differential manner. In the FIG. 3 example, the delay cell 360 can include a first resistor R1, a second resistor R2, a first n-type MOS transistor MN1, and a second n-type MOS transistor MN2. These elements can be coupled together as shown in FIG. 3.

More specifically, the first n-type MOS transistor M1\11 and the second n-type MOS transistor MN2 can respectively include a gate terminal G, a first channel terminal C1 and a second channel terminal C2. The first channel terminals C1 of the two n-type MOS transistors MN1 and MN2 can be coupled to ground; the gate terminals G of the two n-type MOS transistors MN1 and MN2 can be respectively configured as a positive stage input Vin+ and a negative stage input Vin− to receive output signals from a previous oscillation stage; and the second channel terminals C2 of the two n-type MOS transistors MN1 and MN2 can be configured as a negative stage output Vout− and a positive stage output Vout+, respectively. Further, the second channel terminals C2 of the two n-type MOS transistor MN1 and MN2 can be coupled to the first power rail 385 respectively via the first resistor R1 and the second resistor R2. Thus, the first power rail 385 can provide a driving current to the delay cell 360. Due to the reason that the driving current from the first power rail 385 is provided by the switch module 380, a delay of the stage outputs to the stage inputs can depend on the control voltage that controls the current of the switch module 380.

The latch cell 370 can include a first inverter INV1 and a second inverter INV2. In the FIG. 3 example, the first inverter INV1 and the second inverter INV2 can be implemented according to a complementary MOS (CMOS) technology. More specifically, the first inverter INV1 can include an n-type MOS transistor MN3 and a p-type MOS transistor MP1 coupled together as shown in FIG. 3. Similarly, the second inverter INV2 can include an n-type MOS transistor MN4 and a p-type MOS transistor MP2 coupled together as shown in FIG. 3.

The first inverter INV1 and the second inverter INV2 can be cross coupled to latch the negative stage output Vout− and the positive stage output Vout+. Further, the first inverter INV1 and the second inverter INV2 can be coupled to the second power rail 390, such that the first inverter INV1 and the second inverter INV2 can be driven by the substantially constant voltage provided by the voltage regulator 330. The latch cell 370 can speed up the stage outputs to arrive at peak values. Due to the reason that the latch cell 370 is driven by the substantially constant voltage provided by the voltage regulator 330, the peak values of the stage outputs can depend on the substantially constant voltage and may be independent of the control voltage. Thus, the voltage regulator 330 can be suitably configured to enable the peak values of the stage outputs within logically recognizable ranges for all control voltages, in other words all frequencies, without level shifting or automatic level control circuit.

The delay cell 360 and the latch cell 370 can be suitably coupled and configured to enable the second power rail 390 to drive the delay cell 360 when the driving current from the first power rail 385 is not available. For example, when the control voltage is zero, the positive stage input Vin+ is logic "1", and the negative stage input Vin− is logic "0", the first power rail 385 may have a voltage lower than the substantially constant voltage on the second power rail 390, thus the second power rail 390 may drive both the delay cell 360 and the latch cell 370 to enable oscillation. Thus, oscillation can occur even when the control voltage is zero.

According to an embodiment of the disclosure, the oscillation stage 351 can be suitably configured so that it is essentially not adversely impacted by gate oxide stress. In an example, the first n-type MOS transistor MN1 and the second n-type MOS transistor MN2 can be implemented using a thin gate oxide, for example, in the 1.8V technology. The two n-type MOS transistors MN1 and MN2 may have gate oxide stress when a voltage across the thin gate oxide is about or above 1.2V. The voltage regulator 330 and the oscillation stage 351 can be suitably configured, for example, by reducing the substantially constant voltage, and/or increasing the resistance of the first and second resistors R1 and R2, then the voltage across the thin gate oxide of the first and second n-type MOS transistors MN1 and MN2 can be limited to be smaller than a threshold, such as 1.2V, therefore the oscillation stage 351 can be not adversely impacted by gate oxide stress.

According to an embodiment of the disclosure, the oscillation stage 351 can be suitably configured to suppress a VCO gain, and thus reduce a sensitivity to various noises. The VCO gain can be expressed as an oscillation frequency dependency on the control voltage. When the oscillation stage 351 is used in a VCO, the oscillation frequency of the VCO may depend on both the delay cell 360 and the latch cell 370. In the FIG. 3 example, the delay cell 360 can be driven as a function of the control voltage, while the latch cell 370 can be driven independently of the control voltage. Thus, when the latch cell 370 is configured to be stronger than the delay cell 360, the oscillation frequency of the VCO may depend less on the control voltage. Consequently, by doing so, VCO gain can be suppressed.

According to an embodiment of the disclosure, the oscillation stage 351 can be suitably configured to reduce, for example, static power consumption. In an example, the voltage regulator 330 can be configured to increase the substantially constant voltage provided to the oscillation stage 351. By increasing the voltage on the second power rail 390, the oscillation stage 351 may have increased oscillation peak values. The increased oscillation peak values can enable an improved shut-off of transistors, such as the MOS transistors MN1, MN2, MN3, MN4, MP1, and MP2. Thus, with improved transistor shut-off, the static power consumption, which is the leakage current when the transistors are configured in shut-off, can be reduced.

Figure 4:
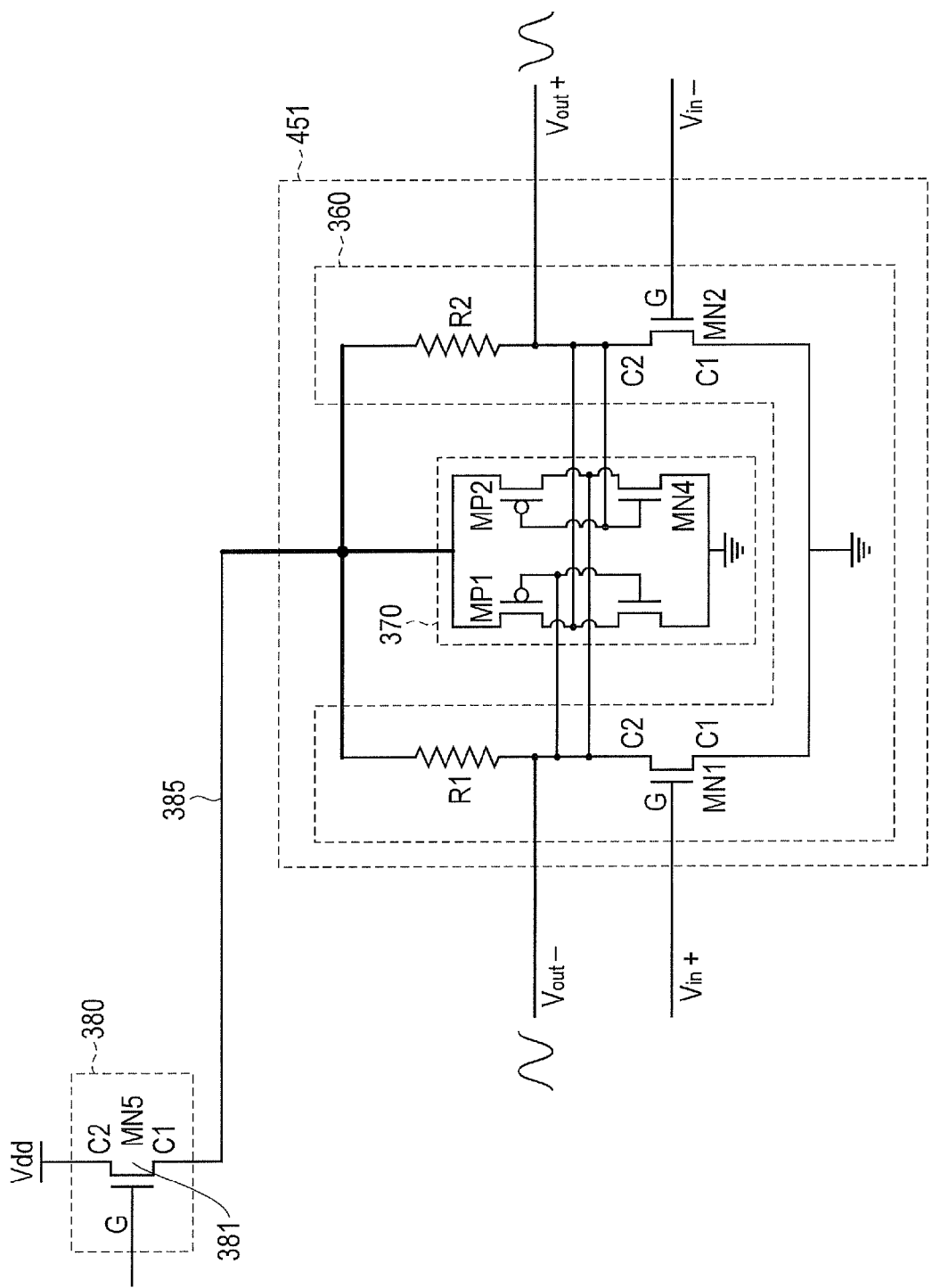
FIG. 4 shows a block diagram of another oscillation stage example for comparison to FIG. 3.

FIG. 4 shows a block diagram of another oscillation stage example for comparison to FIG. 3. The oscillation stage 451 can be similarly configured as the oscillation stage 351, except that the latch cell 370 is coupled to the first power rail 385 instead of the second power rail 390. The delay of the oscillation stage 451 may purely depend on the control voltage.

Figure 5:
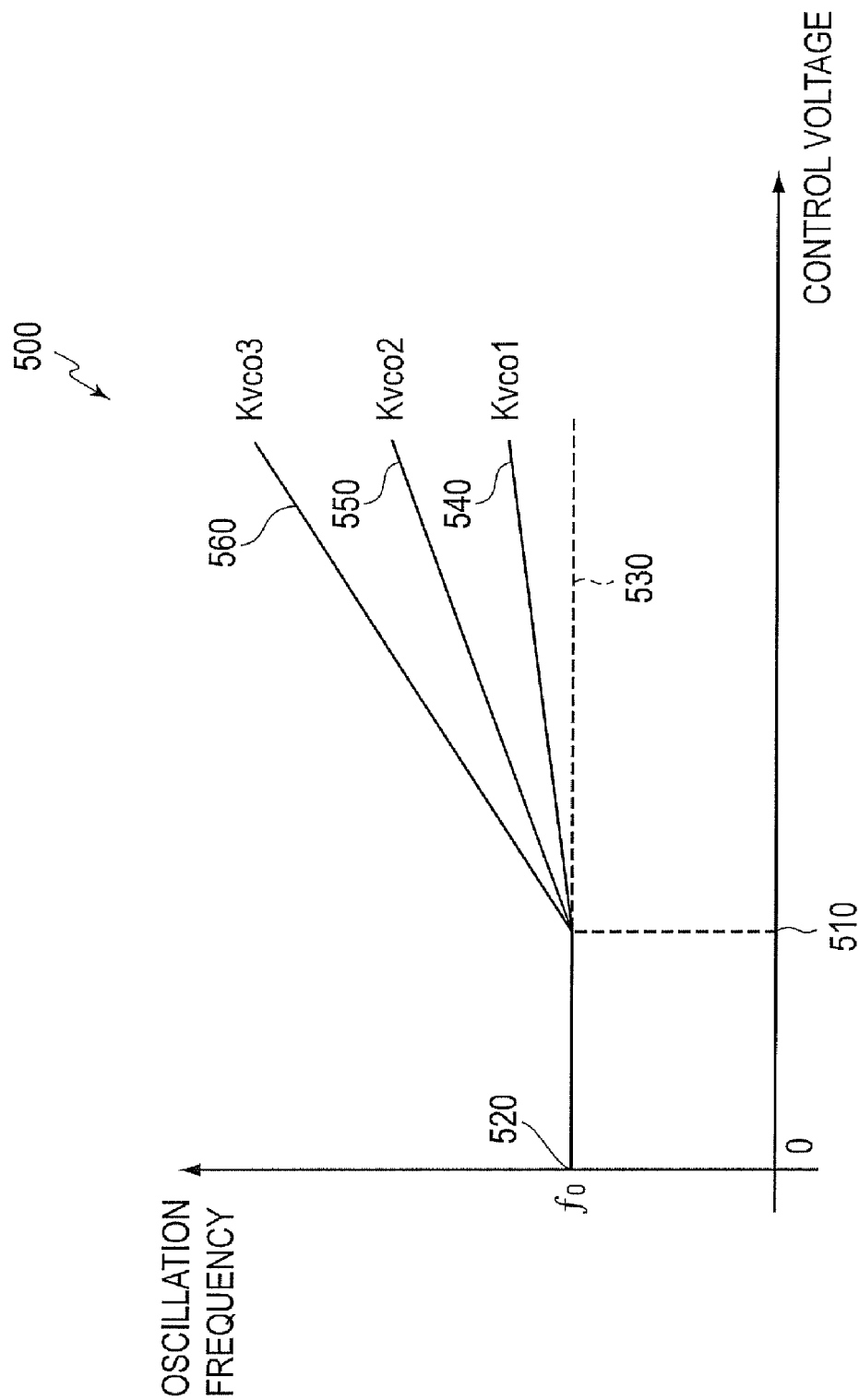
FIG. 5 shows a relationship plot of an oscillation frequency and a control voltage according to an embodiment of the disclosure.

FIG. 5 shows a relationship plot of an oscillation frequency and a control voltage for a VCO module that may include a plurality of coupled together oscillation stages that are configured according to the oscillation stage 351. In FIG. 5, the X axis is the control voltage, and the Y axis is the oscillation frequency. When the control voltage is zero, the delay cell 360 and the latch cell 370 can be driven by the substantially constant voltage provided by the voltage regulator 330. Thus, the VCO module can oscillate with a constant frequency $f_0$, shown by 520 in FIG. 5. When the control voltage increases, the native transistor 381 may start to conduct current to the first power rail 385, as shown by 510 in FIG. 5. The current may additionally drive the delay cell 360, thus the oscillation frequency of the VCO module may start to increase.

The oscillation frequency may increase with regard to the control voltage. The increase rate, in other words the slope, can be referred as VCO gain Kvco. The oscillation stage 351 can be configured to have different VCO gains. FIG. 5 shows 3 curves 540, 550 and 560 corresponding to 3 configurations that may have Kvco1, Kvco2 and Kvco3 respectively. Kvco3 can be the largest and Kvco1 can be the smallest.

According to an embodiment of the disclosure, when an implementation increases a driving strength of the latch cell 370, for example, by sizing the first and second inverters INV1 and INV2, the oscillation frequency may have less dependence on the control voltage, and the VCO gain can be reduced, for example, from Kvco3 to Kvco1. In a case, when the driving strength of the latch cell 370 is much larger than the driving strength of the delay cell 360, the oscillation frequency may stay substantially constant at $f_0$, as shown by 530 in FIG. 5.

Figure 6:
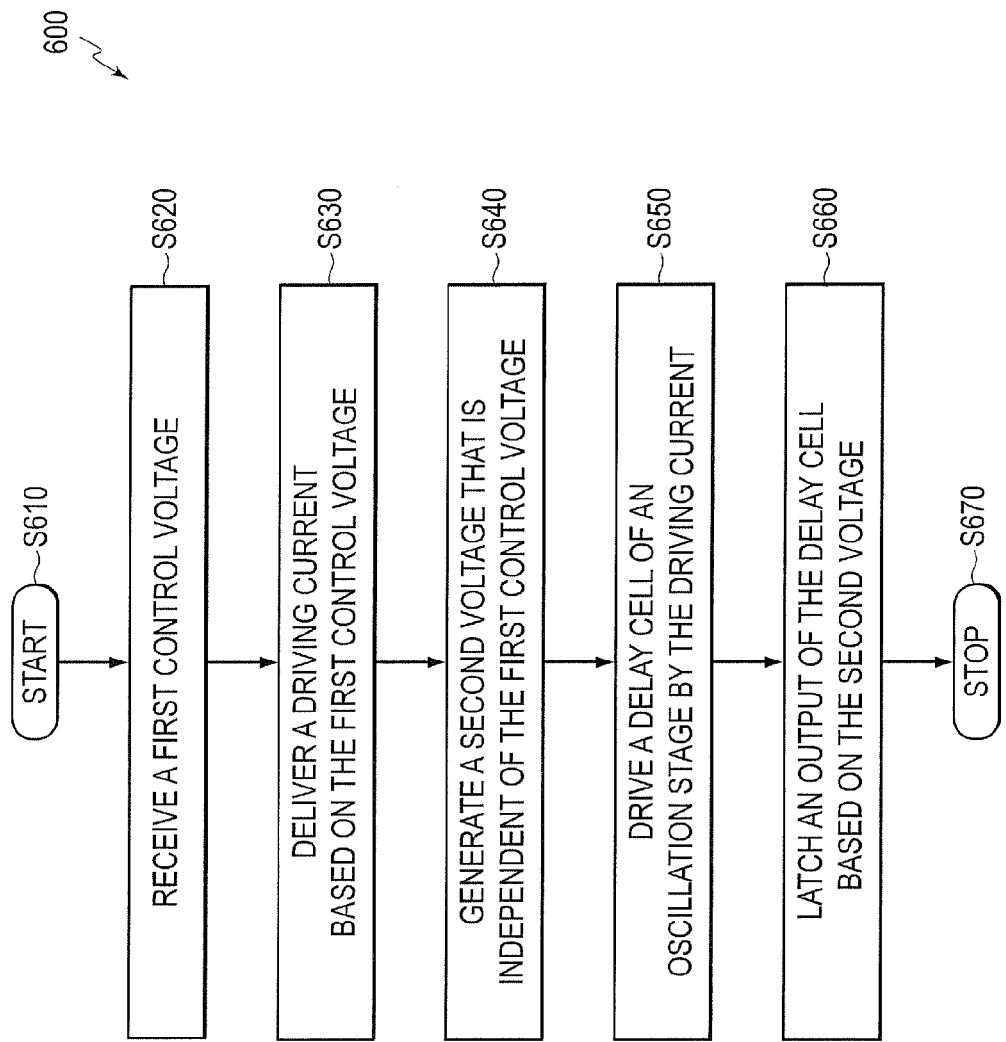
FIG. 6 shows a flow chart outlining a process example for generating an oscillation signal.

FIG. 6 shows a flow chart outlining a process example 600 for generating an oscillation signal according to an embodiment of the disclosure. Generally, a VCO module can include a plurality of oscillation stages. The plurality of oscillations stages can be coupled together to generate an oscillation signal having an oscillation frequency based on delays of the plurality of oscillation stages. According to an embodiment of the disclosure, the VCO module may include an oscillation stage that can be driven by a driving power including a first portion that can be a function of a control voltage, and a second portion that can be substantially independent of the control voltage. Thus, on one hand, the first portion can enable the control voltage to control the oscillation frequency of the VCO; on the other hand, the second portion can enable various features, such as VCO gain suppression, built-in start-up at zero control voltage, no need for level shifting, reduced static power, wide range of control voltage with gate oxide stress worry free, and the like. The process 600 starts at step S610, and proceeds to step S620.

In step S620, the VCO module may receive a first control voltage. Then, the process proceeds to step S630.

In step S630, a driving current may be delivered based on the first control voltage. In an embodiment, the VCO module may include a switch module. The switch module may include a control terminal, a first channel terminal and a second channel terminal. The control terminal may receive the first control voltage, then the switch module can conduct the driving current between the first channel terminal and the second channel terminal based on the first control voltage. According to an aspect of the disclosure, the switch module may include a native MOS transistor, such that the switch module can provide the driving current when the first control voltage is zero. In an embodiment, the driving current can be delivered to a first power rail that can be coupled to the plurality of oscillation stages. The process then proceeds to step S640.

In step S640, a second voltage can be generated. The second voltage can be substantially independent of the first control voltage and can be substantially constant. In an embodiment, the VCO module may include a voltage regulator. The voltage regulator can generate the second voltage based on a semiconductor band-gap voltage, for example. Thus, the second voltage can be substantially constant regardless of various variations, such as process variations, power supply variations, temperature variations, and the like. In an embodiment, the substantially constant voltage can be independent of the first control voltage and can be provided to a second power rail that can be coupled to the plurality of oscillation stages. Then, the process proceeds to step S650.

In step S650, the driving current based on the first control voltage can be used to drive a delay cell of an oscillation stage. In an embodiment, the delay cell can be configured in current mode logic topology. Thus, the delay cell may delay a stage output to a stage input based on the driving current. Then, the process proceeds to step S660.

In step S660, the second voltage can be used by a latch cell of the oscillation stage to latch the stage output. In an embodiment, the second voltage can be configured to enable the stage output to have logically recognizable values, thus level shifting may be not needed. In addition, the latch cell can be coupled to the delay cell in a manner to be able to drive the delay cell when the driving current from the switch module is zero, such that oscillation can start, for example, at any initial condition. Further, the second voltage can be suitably configured to ensure that a voltage across a gate oxide is smaller than a threshold, such that the VCO module can avoid adverse impact of gate oxide stress. The process then proceeds to step S670 and terminates.

It is noted that the above process is described in steps for ease of description, various components of the VCO module can be configured to perform the above steps at the same time, and at all time.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A voltage controlled oscillator, comprising:
a plurality of oscillation stages coupled together to generate an oscillation signal having an oscillation frequency, at least one oscillation stage including a first portion driven by a first driving power that is a function of a control voltage and a second portion coupled to two power rails, voltages of the two power rails being substantially independent of the control voltage and a larger voltage of the two power rails being smaller than a supply voltage provided to the first portion, and the two power rails providing to the second portion a second driving power that is substantially independent of the control voltage.

2. The voltage controlled oscillator of claim 1, wherein a first power rail and a third power rail are configured to provide the first driving power in the form of a driving current that is a function of the control voltage; and a second power rail and a fourth power rail are configured to provide the second driving power in the form of a substantially constant voltage.

3. The voltage controlled oscillator of claim 2, wherein:
the first portion comprises a delay cell coupled between the first power rail and the third power rail, the delay cell being configured to receive a stage input from a previous oscillation stage and drive a stage output to a next oscillation stage with the driving current that is the function of the control voltage; and
the second portion comprises a latch cell coupled between the second power rail and the fourth power rail, the latch cell being configured to latch the stage output based on the substantially constant voltage.

4. The voltage controlled oscillator of claim 1, wherein the oscillation stage is configured in a differential manner.

5. The voltage controlled oscillator of claim 2, further comprising:
a voltage regulator coupled to the second power rail, the voltage regulator being configured to generate the substantially constant voltage based on a semiconductor band-gap voltage.

6. The voltage controlled oscillator of claim 2, further comprising:
a switch module having a control terminal for receiving the control voltage, a first channel terminal coupled to a power supply and a second channel terminal coupled to the first power rail, the switch module being configured to conduct the driving current from the first terminal to the second terminal based on the control voltage on the control terminal.

7. The voltage controlled oscillator of claim 6, wherein the switch module further comprises:
at least a metal oxide semiconductor (MOS) transistor that is native, which is configured to conduct a current with zero gate-source voltage.

8. The voltage controlled oscillator of claim 3, wherein the delay cell further comprises:
   a MOS transistor having a gate terminal, a first channel terminal and a second channel terminal, the gate terminal being configured to receive the stage input; and
   a resistor configured to serially couple the MOS transistor between the first power rail and a ground node as a resistive load to the MOS transistor.

9. The voltage controlled oscillator of claim 3, wherein the latch cell further comprises:
   a first inverter and a second inverter that are cross coupled.

10. A method for generating an oscillation signal, comprising:
   receiving a control voltage; and
   driving a first portion of an oscillation stage with a first driving power that is a function of the control voltage; and
   driving a second portion of the oscillation stage, using two power rails with rail voltages being substantially independent of the control voltage and a larger voltage of the two power rails being smaller than a supply voltage provided to the first portion, with a second driving power that is substantially independent of the control voltage.

11. The method of claim 10, further comprising:
   delivering to the first portion, using a first power rail and a third power rail, a driving current based on the control voltage as the first driving power; and
   generating a substantially constant voltage for a second power rail that is one of the two power rails for driving the second portion.

12. The method of claim 11, further comprising:
   driving a delay cell of the oscillation stage with the driving current; and
   latching an output of the delay cell with the substantially constant voltage.

13. The method of claim 12, wherein generating the substantially constant voltage as the second portion of the driving power further comprises:
   generating the substantially constant voltage such that the output of the delay cell is logically recognizable without additional level shifting or level controlling.

14. The method of claim 11, wherein generating the substantially constant voltage for the second power rail that is one of the two power rails for driving the second portion, further comprises:
   generating the substantially constant voltage based on a semiconductor band-gap voltage.

15. An electronic device having an integrated circuit (IC) chip, the IC comprising:
   a phase-locked loop having a detector module, and a voltage controlled oscillator (VCO) module coupled together, the detector module being configured to detect a difference between an oscillation signal outputted from the VCO module and a received signal, and convert the difference into a control voltage, wherein the VCO module further comprises:
      a plurality of oscillation stages coupled together to generate the oscillation signal, at least one oscillation stage including a first portion driven by a first driving power that is a function of the control voltage and a second portion coupled to two power rails, voltages of the two power rails being substantially independent of the control voltage and a larger voltage of the two power rails being smaller than a supply voltage provided to the first portion, and the two power rails providing to the second portion a second driving power that is substantially independent of the control voltage.

16. The electronic device of claim 15, wherein
   a first power rail and a third power rail are configured to provide the first driving power in the form of a driving current that is a function of the control voltage; and
   a second power rail and a fourth power rail are configured to provide the second driving power in the form of a substantially constant voltage.

17. The electronic device of claim 16, wherein:
   the first portion comprises a delay cell coupled between the first power rail and the third power rail, the delay cell being configured to receive a stage input from a previous oscillation stage and drive a stage output to a next oscillation stage with the driving current that is the function of the control voltage; and
   the second portion comprises a latch cell coupled between the second power rail and the fourth power rail, the latch cell being configured to latch the stage output based on the substantially constant voltage.

18. The electronic device of claim 15, wherein the VCO module further comprises:
   a voltage regulator coupled to second power rail, the voltage regulator being configured to generate the substantially constant voltage based on a semiconductor band-gap voltage.

19. The electronic device of claim 15, wherein the VCO module further comprises:
   a switch module having a control terminal for receiving the control voltage, a first channel terminal coupled to a power supply and a second channel terminal coupled to the first power rail, the switch module being configured to conduct the driving current from the first terminal to the second terminal based on the control voltage on the control terminal.

20. The electronic device of claim 17, wherein the delay cell further comprises:
   a metal oxide semiconductor (MOS) transistor having a gate terminal, a first channel terminal and a second channel terminal, the gate terminal being configured to receive the stage input; and
   a resistor configured to serially couple the MOS transistor between the first power rail and a ground node as a resistive load to the MOS transistor.

21. The voltage controlled oscillator of claim 1, wherein the first portion further comprises at least a metal oxide semiconductor (MOS) transistor, and the voltages of the two power rails coupled to the second portion are regulated to cause a voltage across a gate oxide of the MOS transistor to be smaller than a threshold.

* * * * *